(12) United States Patent
Yang et al.

(10) Patent No.: US 6,646,462 B1
(45) Date of Patent: Nov. 11, 2003

(54) EXTRACTION OF DRAIN JUNCTION OVERLAP WITH THE GATE AND THE CHANNEL LENGTH FOR ULTRA-SMALL CMOS DEVICES WITH ULTRA-THIN GATE OXIDES

(75) Inventors: Nian Yang, San Jose, CA (US); Zhigang Wang, Santa Clara, CA (US); Xin Guo, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/178,144

(22) Filed: Jun. 24, 2002

(51) Int. Cl.$^7$ ................................................ H01L 29/98
(52) U.S. Cl. ........................ 324/769; 324/765; 257/48
(58) Field of Search ........................... 257/48; 324/765, 324/769

(56) References Cited

U.S. PATENT DOCUMENTS

| | | | |
|---|---|---|---|
| 5,034,791 A | * 7/1991 | Kameyama et al. | |
| 5,194,923 A | 3/1993 | Vinal | |
| 5,348,897 A | * 9/1994 | Yen | |
| 5,648,920 A | 7/1997 | Duvvury et al. | |
| 6,069,485 A | 5/2000 | Long et al. | |
| 6,166,558 A | 12/2000 | Jiang et al. | |
| 6,229,164 B1 | 5/2001 | Momose et al. | |

OTHER PUBLICATIONS

"Experimental Determination of Electrical, Metallurgical, and Physical Gatge Lengths of Submicron MOSFET's", Xing Zhou and Yong Lim, Modeling and Simulation of Microsystems 2001, (www.cr.org), ISBN 0–9708275–0–4, pp. 44–47.

"A New 'Critical–Current at Linear–Threshold' Methof for Direct Extraction of Deep–Submicron MOSFET Effective Channel Length", IEEE Transactions on Electron Devices, vol. 46, No. 7, Jul., 1999, X. Zhou, K. Y. Lim and D. Lim, 3 pages.

* cited by examiner

*Primary Examiner*—Fetsum Abraham
(74) *Attorney, Agent, or Firm*—Eschweiler & Associates LLC

(57) ABSTRACT

The present invention generally relates to a method of determining a source/drain junction overlap and a channel length of a small device, such as a MOS transistor. A large reference device having a known channel length is provided, and a source, drain, and substrate on which the device has been formed are grounded. A predetermined gate voltage is applied to a gate of the large device, and a gate to channel current of the reference device is measured. A source, drain, and substrate on which the small device has been formed are grounded, and the predetermined voltage is applied to a gate of the small device, and a gate to channel current of the small device is measured. The substrate and one of the source or the drain of the small device is floated, and a predetermined drain voltage is applied to source or the drain which is not floating. A gate to drain current for the small device is measured, and a source/drain junction overlap length is calculated. The source/drain junction overlap length is then used to calculate the channel length of the small device.

30 Claims, 5 Drawing Sheets

EXTRACTION OF DRAIN JUNCTION OVERLAP WITH THE GATE AND THE CHANNEL LENGTH FOR ULTRA-SMALL CMOS DEVICES WITH ULTRA-THIN GATE OXIDES

TECHNICAL FIELD OF INVENTION

The present invention relates generally to integrated circuits and fabrication inspection techniques. More particularly, the present invention relates to integrated circuits and fabrication techniques that facilitate the measurement of source/drain junction overlap and channel length in MOS transistors.

BACKGROUND OF THE INVENTION

In the semiconductor industry, device sizes are becoming smaller and smaller. Performance of devices, such as transistors that are fabricated in an integrated circuit, strongly depend on the precision of manufacturing small features which form the transistor, as well as the characterization of the various features.

In the field of metal-oxide-silicon (MOS) transistors, advances in manufacturing and integration techniques of metal-oxide-silicon field effect transistors (MOSFETs) have allowed for devices having a gate length of substantially less than 0.5 microns. As the gate length decreases, however, various parasitic effects can have a significant impact on the performance of the device. Furthermore, as technology continues to provide for smaller and smaller gate lengths, a physical gate length (i.e., metallurgical length of the gate from junction to junction) fails to directly correlate with an effective electrical channel length (i.e., an electrical parameter which can be used to accurately define the performance of the device).

One method of determining the electrical channel length in the prior art has been to use a capacitance-voltage (C-V) method, wherein a voltage is applied to the drain of the transistor and the resulting capacitance in the channel region is measured to determine the effective electrical channel length of the transistor. This method, however, tends to fail when the gate length of the transistor is decreased below 0.5 microns. Failure of the C-V method to accurately determine the channel length is due, at least in part, to the relative capacitance of a source/drain junction overlap of the transistor. A length of the source/drain junction overlap remains generally constant, independent of gate length, and therefore the source/drain junction overlap plays a greater role in the measured capacitance in the C-V method as the gate length decreases. The source/drain junction overlap of a small transistor having a gate length of less than 0.5 microns can therefore have a detrimental effect on the determination of the electrical channel length using the C-V method.

Another method of determining the gate length and effective channel length of a transistor in the prior art has been to use a current-voltage (I-V) method, wherein a drain voltage is applied to the transistor and the resulting current between the drain and the source is measured. This method, however, requires that a source/drain junction overlap width be known prior to the determination of the gate length. Typically, the source/drain junction overlap width is ascertained from empirical data, such as through the use of scanning electron microscopy (SEM). Utilizing SEM to measure the source/drain junction overlap width, however, is typically destructive to the device, and furthermore cannot typically be performed in-situ.

Therefore, a method of determining the source/drain junction overlap and the channel length of devices such as MOS transistors is needed, wherein an accurate effective electrical channel length and source/drain junction overlap length can be determined in-situ in a non-destructive manner.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its primary purpose is to present some concepts of the invention in a simplified form as a prelude to the more detailed description that is presented later.

The present invention relates generally to a method for determining a junction overlap and a channel length of a small device such as a MOS transistor formed on a semiconductor substrate. The method comprises utilizing a large reference device formed on the substrate, the reference device having a source, a drain, and a gate, wherein a channel is defined between the source and the drain of the reference device. In accordance with one exemplary aspect of the present invention, the length of the channel of the reference device is known, and the source, drain, and substrate are grounded. A predetermined gate voltage is applied to the gate of the reference device, and a gate to channel current is measured.

The small device also comprises a source, a drain, and a gate, and a channel is furthermore defined between the source and the drain of the small device. In accordance with another aspect of the present invention, the source, drain, and substrate are grounded, and a predetermined gate voltage is applied to the gate of the small device. A gate to channel current is also measured for the small device.

The substrate and one of the source or the drain of the small device are floated, and a predetermined drain voltage is applied to the source or the drain which is not floating. Consequently, the current between the respective source or the drain which is not floating and the gate is measured. According to yet another exemplary aspect of the invention, a source/drain junction overlap length is calculated by multiplying the known channel length of the reference device by the measured current between the gate and the respective source or drain of the small device, and dividing by the measured current between the gate and the channel of the reference device.

In accordance with still another exemplary aspect of the present invention, the channel length of the small device is determined by multiplying the known channel length of the reference device by the measured current between the gate and the channel of the small device, dividing by the measured current between the gate and the channel of the large device, and then subtracting twice the calculated overlap.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figures 1, 2:
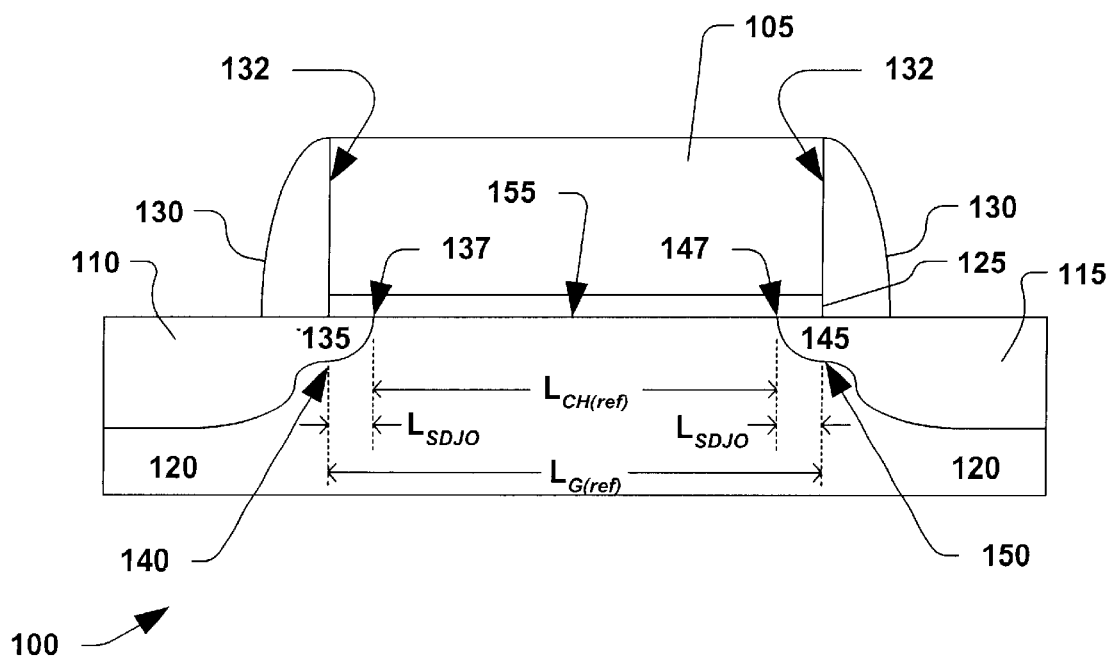
FIG. 1 illustrates a cross-sectional view of an exemplary large reference transistor in accordance with the present invention.
FIG. 2 illustrates a cross-sectional view of an exemplary small transistor in accordance with the present invention.

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. In other instances, well-known structures and devices are shown in block diagram form in order to facilitate description of the present invention. It is also to be understood that like reference numerals throughout the description imply similar functionality, however the use of like reference numerals does not necessarily imply the same device.

The present invention is directed to determining a source/drain junction overlap length and an effective channel length of a small device (e.g., a MOS transistor having a gate length on the order of 0.5 microns or less). The source/drain junction overlap and the effective channel length of the small device is determined by utilizing a proportional relationship of the small device to a relatively large reference device (e.g., a MOS transistor having a gate length on the order of 4 microns or more). FIG. 1 illustrates an exemplary large reference transistor 100 comprising a gate 105, a source 110, and a drain 115 which have been formed on a silicon substrate 120. The gate 105 of the reference transistor 100 is separated from the substrate 120 by a thin insulating layer 125 (e.g., a thin oxide layer), thereby defining a gate oxide. According to one exemplary aspect of the invention, the insulating layer has a thickness of less than about 3 nanometers.

The reference transistor 100 further comprises sidewall spacers 130 which have been formed on opposite ends 132 of the gate 105. The reference transistor 100, for example, has a metallurgical gate length $L_{G(ref)}$ of 5 microns or more (e.g., 10 microns), wherein the metallurgical gate length $L_{G(ref)}$ is defined as the length of the gate 105 residing between the spacers 130.

A doped source extension 135 extends from the source 110 of the reference transistor 100 to a first point 137 under the gate 105, such that the gate overlies a portion of the source extension, thereby defining a source junction overlap region 140 of the reference transistor. A doped drain extension 145 extends from the drain 115 of the reference transistor 100 to a second point 147 under the gate 105, such that the gate overlies another portion of the drain extension, thereby defining a drain junction overlap region 150 of the reference transistor. The source junction overlap region 140 and the drain junction overlap region 150 are characterized, for example, by a source/drain junction overlap length $L_{SDJO}$, wherein the source/drain junction overlap length $L_{SDJO}$ is measured from either the first point 137 under the gate 105 to the end 132 of the gate nearest the source 110, or the second point 147 under the gate 105 to the end 132 of the gate nearest the drain 115. As will be understood by one of ordinary skill in the art, the source/drain junction overlap length $L_{SDJO}$ is generally equal for both the source junction overlap region 140 and the drain junction overlap region 150.

A channel length $L_{CH(ref)}$ of the reference transistor 100 is defined as the length of a channel 155 spanning from the first point 137 under the gate 105 to the second point 147 under the gate (i.e., the distance between the source junction overlap region 140 and the drain junction overlap region 150). Therefore, it follows that a metallurgical gate length $L_{G(ref)}$ of the reference transistor 100 (i.e., the physical length of the gate 105 between the spacers 130) is equal to the sum of the channel length $L_{CH(ref)}$ and twice the source/drain junction overlap length $L_{SDJO}$.

FIG. 2 illustrates an exemplary small transistor 200 which has been formed on the silicon substrate 120 according to the present invention. The exemplary small transistor 200 comprises a gate 205, a source 210, and a drain 215, wherein the gate 205 is characterized by a metallurgical gate length $L_G$ of less than 0.5 microns. The gate 205 of the small transistor 200, for example, is also formed on the substrate 120, and is separated from the substrate by the thin insulating layer 125. The small transistor 200 further comprises spacers 230 which are formed on opposite ends 232 of the gate 205.

A doped source extension 235 of the small transistor 200 extends from the source 210 to a first point 237 under the gate 205, such that the gate overlies a portion of the source extension, thereby defining a source junction overlap region 240 of the small transistor 200. The source junction overlap region 240 is also characterized, for example, by the source junction overlap length $L_{SDJO}$, whereby the source junction overlap length $L_{SDJO}$ is measured from the first point 237 under the gate 205 to the end 232 of the gate nearest the source 210. A doped drain extension 245 of the small transistor 200 extends from the drain 215 to a second point 247 under the gate 205, such that the gate overlies a portion of the drain extension, thereby defining a drain junction overlap region 250 of the small transistor 200. The source junction overlap region 240 and the drain junction overlap region 250 are also characterized, for example, by the source/drain junction overlap length $L_{SDJO}$, wherein the source/drain junction overlap length $L_{SDJO}$ is measured from either the first point 237 under the gate 205 to the end 232 of the gate nearest the source 210, or the second point 247 under the gate 205 to the end 232 of the gate nearest the drain 215.

Figure 3:
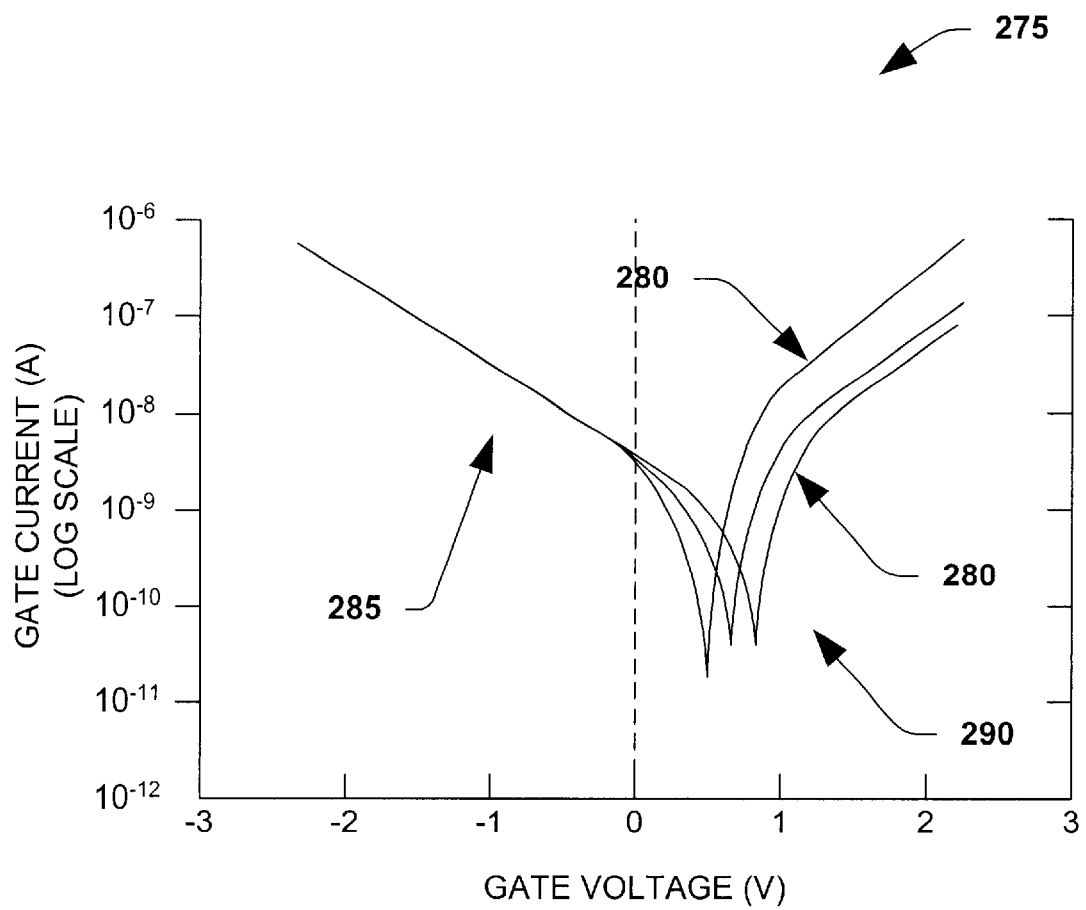
FIG. 3 illustrates a graph of gate current versus gate voltage in a small transistor in accordance with one aspect of the present invention.

As will be understood by one of ordinary skill in the art, the source/drain junction overlap length $L_{SDJO}$ is substantially equal in both the large reference transistor 100 and the small transistor 200 because they have undergone the same junction formation processes in the fabrication. For example, FIG. 3 illustrates a graph 275 of gate current versus gate voltage for a variety of transistor gate sizes. As can be seen in the graph 275, curves 280 illustrate gate to channel current and gate to drain current for a plurality of transistors having gate lengths ranging from 0.5 microns to 5 microns when a drain to source voltage is set to 1.5 volts. The curves 280 coincide with one another in a first region 285 when the gates are negatively biased, and diverge from one another in a second region 290 when the gate voltage increases. This implies that the size of the source/drain junction overlap is substantially constant regardless of channel length.

In accordance with the present invention, a channel length $L_{CH}$ of the small transistor 200 of FIG. 2 is defined as the length of a channel 255 spanning from the first point 237 under the gate 205 to the second point 247 under the gate (i.e., the distance between the source junction overlap region 240 and the drain junction overlap region 250). Therefore, it follows that the metallurgical gate length $L_G$ of the small transistor 200 (i.e., the physical length of the gate 205) is equal to the sum of the channel length $L_{CH}$ and twice the source/drain junction overlap length $L_{SDJO}$. As will be understood by one of ordinary skill in the art, the source junction overlap length and the drain junction overlap length are considered equal in length.

Figure 4:
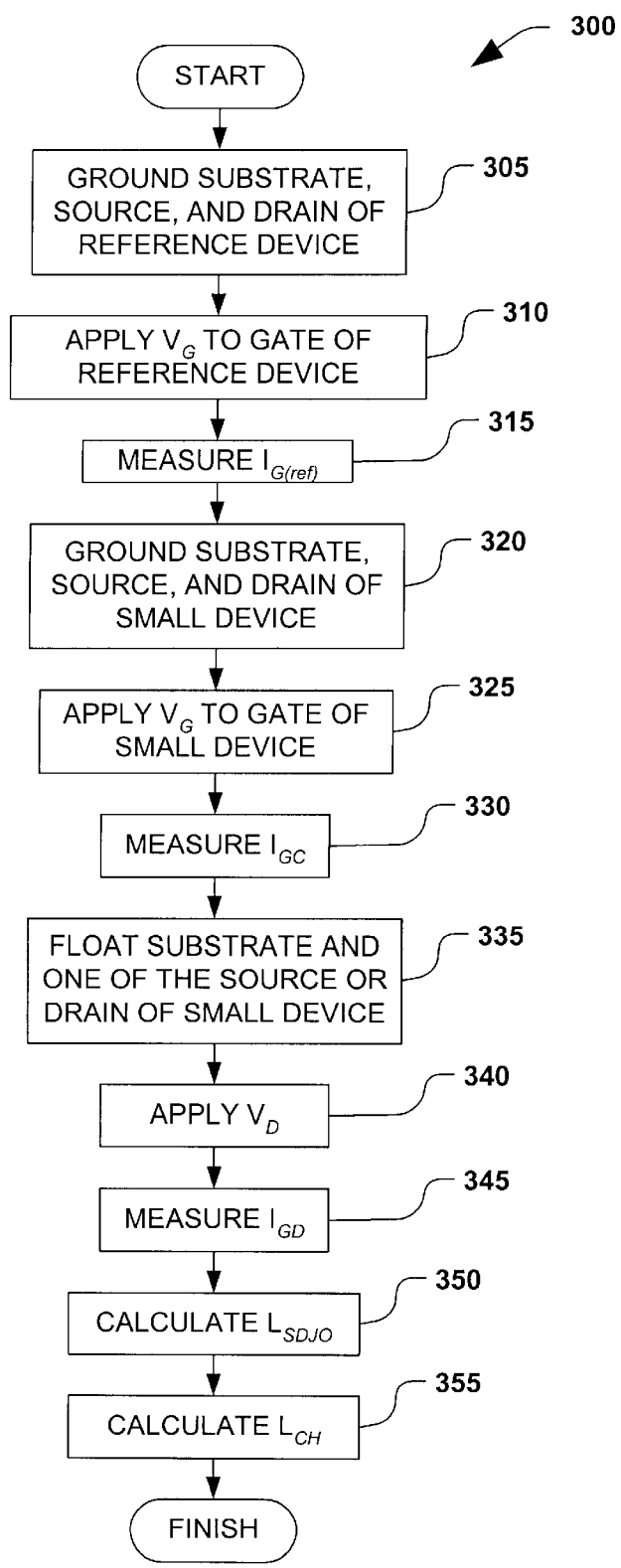
FIG. 4 is a flow chart diagram representation of a method for determining a source/drain junction overlap and channel length of a small device in accordance with one aspect of the present invention.

FIG. 4 illustrates an exemplary method 300 of determining the source/drain junction overlap $L_{SDJO}$ and the effective channel length $L_{CH}$ of a small transistor according to the present invention. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Figure 5:
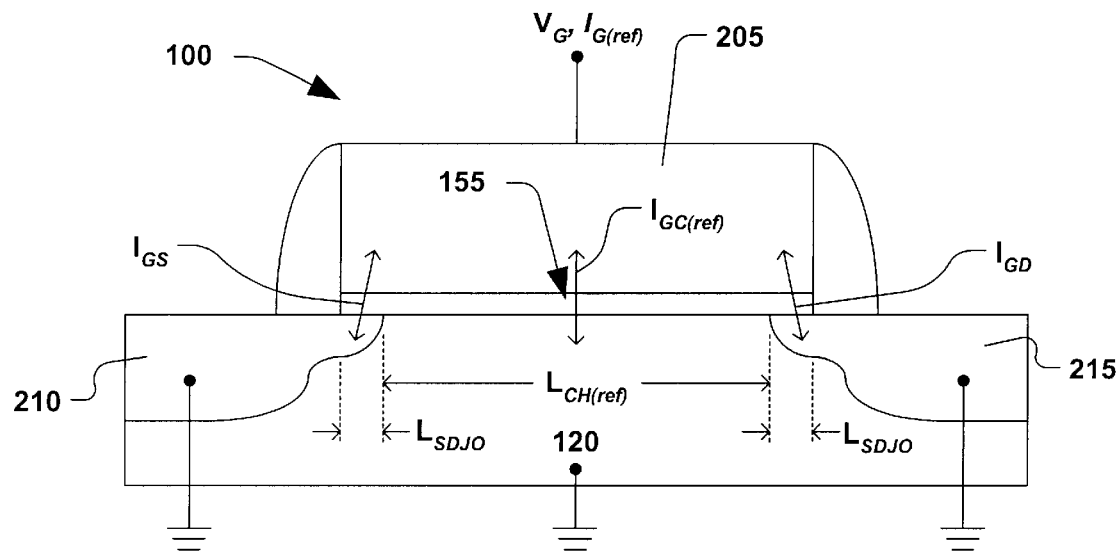
FIG. 5 illustrates a cross-sectional view of an exemplary large reference transistor having a source, drain, and substrate grounded in accordance with one aspect of the present invention.

The method 300 begins with act 305 wherein, as illustrated in FIG. 5, the substrate 120, the source 110, and the drain 115 of the reference transistor 100 are grounded. At act 310 of FIG. 4, a predetermined gate voltage $V_G$ is applied to the gate 105 of the reference transistor 100, and the total gate current $I_{G(ref)}$ across the gate is measured for the reference transistor at act 315. The gate voltage $V_G$, for example, is selected to be within the operating voltage of the large device (e.g., 1.5 volts). Due to the channel length $L_{CH(ref)}$ being quite large as compared to the source/drain junction overlap $L_{SDJO}$ of the large reference transistor 100, the channel length $L_{CH(ref)}$ can be considered approximately equal to the gate length $L_{G(ref)}$ for the reference transistor. Likewise, for the same reason, the gate to source current $I_{GS(ref)}$ and the gate to drain current $I_{GD(ref)}$ passing through the respective doped source extension 135 and the doped drain extension 145 can be neglected. Therefore, the measured total current $I_{G(ref)}$ across the gate 105 can be considered approximately equal to the gate to channel current $I_{GC(ref)}$ for the reference transistor 100.

Figure 6:
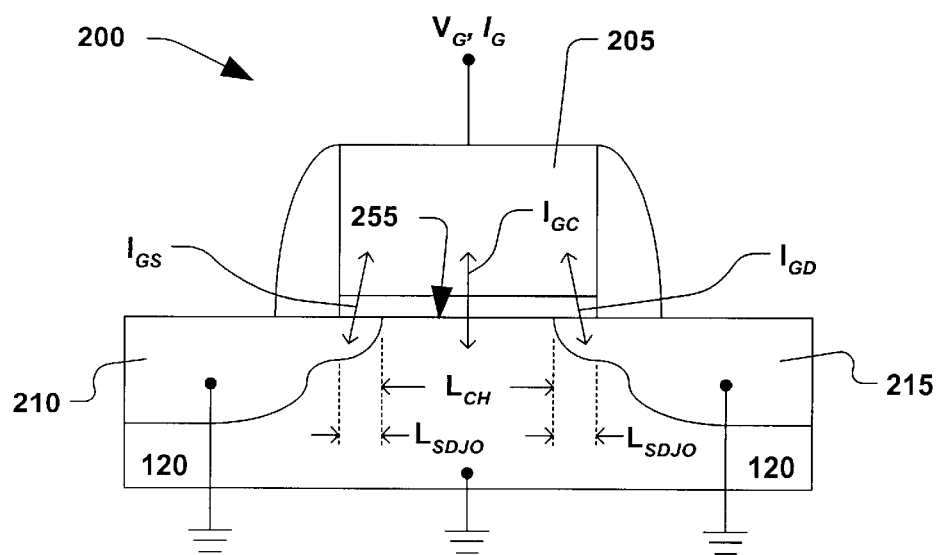
FIG. 6 illustrates a cross-sectional view of an exemplary small transistor having a source, drain, and substrate grounded in accordance with one aspect of the present invention.
Figure 7:
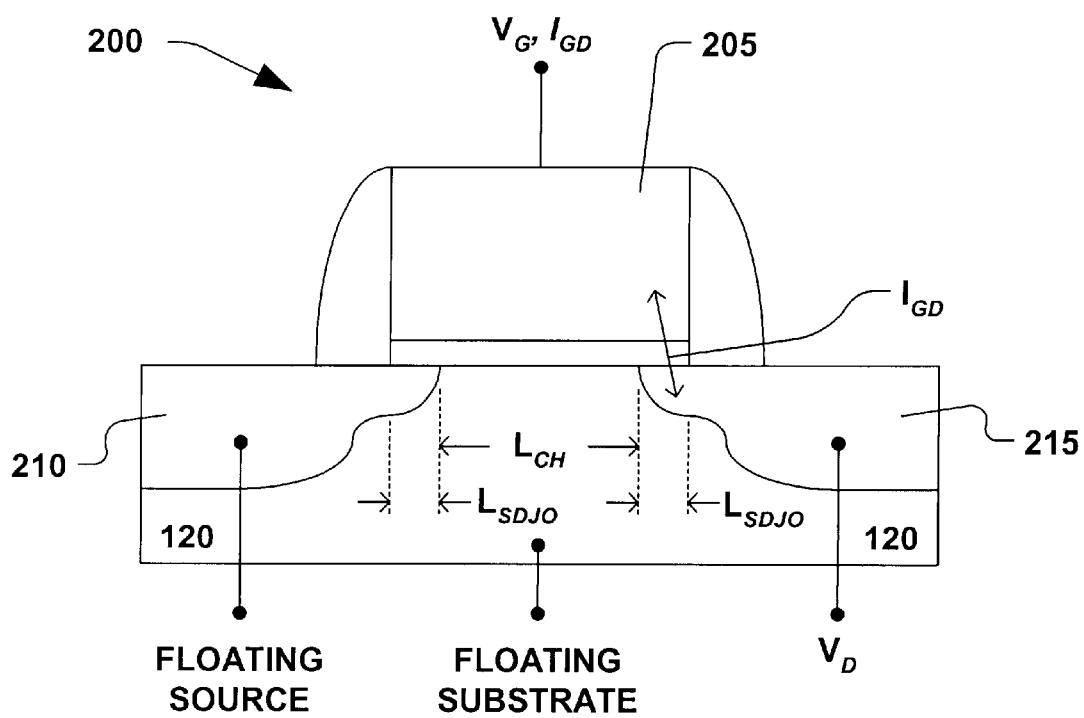
FIG. 7 illustrates a cross-sectional view of an exemplary small transistor having a source and substrate floating in accordance with one aspect of the present invention.

The method 300 continues with act 320 of FIG. 4, wherein, as illustrated in FIG. 6, the substrate 120, the source 210, and the drain 215 of the small transistor 200 are grounded. Act 325 of FIG. 4 illustrates an application of the predetermined gate voltage $V_G$ to the gate 205 of the small transistor 200, and the gate to channel current $I_{GC}$ is measured for the small transistor at act 330. As illustrated in FIG. 7, the substrate 120 and one of the source 210 or the drain 215 of the small transistor 200 are floated at act 335 of FIG. 4. Furthermore, act 340 is performed, wherein a predetermined drain voltage $V_D$ is applied to either of the source 210 or the drain 215 which is not floating.

For purposes of clarity, the proceeding acts are illustrated wherein the source 210 is floating and the predetermined drain voltage $V_D$ is applied to the drain 215. However, as will be understood by one of ordinary skill in the art, the predetermined drain voltage $V_D$ can be alternatively applied to the source 210 while floating the drain 215 to achieve a similar result. While the predetermined drain voltage $V_D$ is applied, act 345 is performed, wherein the gate to drain current $I_{GD}$ is measured. According to one exemplary aspect of the invention, the gate to drain current $I_{GD}$ is measured while $V_G$ is set to zero volts. According to another exemplary aspect of the invention, the gate to drain current $I_{GD}$ is measured when the predetermined gate voltage $V_G$ is nonzero, and the gate to drain current $I_{GD}$ is measured using the potential difference between the predetermined gate voltage $V_G$ applied to the gate 205 and the predetermined drain voltage $V_D$ applied to the drain 215.

Act 350 of FIG. 4 illustrates a calculation to determine the source/drain junction overlap length $L_{SDJO}$. The overlap $L_{SDJO}$ of the respective source or drain is calculated by multiplying the known channel length $L_{CH(ref)}$ of the reference transistor 100 by the measured current $I_{GD}$ between the gate and the respective source 210 or drain 215 of the small device 200, and dividing by the measured current $I_{GC(ref)}$ between the gate 105 and the channel 155 of the reference device 100, as illustrated in equation 1:

$$L_{SDJO} = \frac{(L_{CH(ref)})(I_{GD})}{I_{GC(ref)}} \qquad \text{(Equation 1)}$$

According to one exemplary aspect of the present invention, the channel length $L_{CH}$ of the small transistor 200 is further calculated at act 355 of FIG. 4, wherein the known channel length $L_{CH(ref)}$ of the reference device is multiplied by the measured current $I_{GC}$ between the gate 205 and the channel 255 of the small device 200, and divided by the measured current $I_{GC(ref)}$ between the gate 105 and the channel 155 of the large device 100, and then twice the calculated overlap $L_{SDJO}$ is subtracted, as illustrated in equation 2:

$$L_{CH} = \frac{(L_{CH(ref)})(I_{GC})}{I_{GC(ref)}} - 2(L_{SDJO}) \qquad \text{(Equation 2)}$$

In accordance with another exemplary aspect of the present invention, a statistical correction factor can be added to one or more of the source/drain junction overlap or the channel length $L_{CH}$. The statistical correction factor can, for example, be derived empirically by direct measurements of the source/drain junction overlap $L_{SDJO}$ or channel length $L_{CH}$ from a statistically significant number of devices. Empirical data can comprise, for example, SEM measurements of the source/drain junction overlap $L_{SDJO}$ or channel length $L_{CH}$ of small devices. Alternatively, the statistical correction factor is derived, for example, from a model.

The method 300 can, for example, be performed in-situ, wherein one or more of the source/drain junction overlap $L_{SDJO}$ or channel length $L_{CH}$ are determined without destroying the large device 100 or the small device 200. Furthermore, the method 300 can be automated for quality control purposes.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A method for determining a junction overlap ($L_{SDJO}$) and a channel length ($L_{CH}$) of a small device on a substrate, the small device having a gate, a source and a drain, wherein a channel is defined between the source and the drain of the small device, the method comprising:

providing a large reference device on the substrate, the reference device having a gate, a source and a drain, wherein a channel of known length ($L_{CH(ref)}$) is defined between the source and the drain of the reference device;

grounding the source and the drain of the reference device and the substrate;

applying a predetermined gate voltage ($V_G$) to the gate of the reference device;

measuring the current ($I_{GC(ref)}$) between the gate and the channel of the reference device;

grounding the source and the drain of the small device and the substrate;

applying the predetermined gate voltage ($V_G$) to the gate of the small device;

measuring the current ($I_{GC(ref)}$) between the gate and the channel of the small device;

floating the substrate and one of the source or the drain of the small device;

applying a predetermined drain voltage ($V_D$) to the respective source or drain of the small device which is not floating;

measuring the current ($I_{GD}$) between the gate of the small device and the respective source or drain of the small device which is not floating;

calculating the overlap ($L_{SDJO}$) of the respective source or drain by using the known channel length ($L_{CH(ref)}$) of the reference device, the measured current ($I_{GD}$) between the gate and the respective source or drain of the small device, and the measured current ($I_{GC(ref)}$) between the gate and the channel of the reference device; and calculating the channel length ($L_{CH}$) of the small device by using the known channel length ($L_{CH(ref)}$) of the reference device, the measured current ($I_{GC}$) between the gate and the channel of the small device, the measured current ($I_{GC(ref)}$) between the gate and the channel of the large device, and the calculated overlap ($L_{SDJO}$).

2. The method of claim 1, wherein calculating the overlap ($L_{SDJO}$) of the respective source or drain is accomplished by multiplying the known channel length ($L_{CH(ref)}$) of the reference device by the measured current ($I_{GD}$) between the gate and the respective source or drain of the small device, and dividing by the measured current ($I_{GC(ref)}$) between the gate and the channel of the reference device.

3. The method of claim 1, wherein calculating the channel length ($L_{CH}$) of the small device is performed by multiplying the known channel length ($L_{CH(ref)}$) of the reference device by the measured current ($I_{GC}$) between the gate and the channel of the small device, dividing by the measured current ($I_{GC(ref)}$) between the gate and the channel of the large device, and then subtracting twice the calculated overlap ($L_{SDJO}$).

4. The method of claim 1, wherein the predetermined gate voltage ($V_G$) is within the operating voltage of the large device and the small device.

5. The method of claim 1, wherein the predetermined gate voltage ($V_G$) is approximately 1.5 volts.

6. The method of claim 1, wherein the channel length ($L_{CH(ref)}$) of the reference device is greater than 4 microns.

7. The method of claim 1, wherein the channel length ($L_{CH}$) of the small device is less than 0.5 microns.

8. The method of claim 1, wherein the gate comprises a gate oxide with a thickness of less than 3 nm.

9. The method of claim 1, wherein the junction overlap ($L_{SDJO}$) and the channel length ($L_{CH}$) are determined in-situ.

10. The method of claim 1, wherein the small device and the large device are metal-oxide-semiconductor field effect transistors (MOSFETs).

11. The method of claim 1, wherein the predetermined gate voltage ($V_G$) is equal to the predetermined drain voltage ($V_D$).

12. The method of claim 1, wherein the junction overlap ($L_{SDJO}$) of the reference device is negligible compared to the channel length ($L_{CH(ref)}$) of the reference device.

13. The method of claim 1, further comprising adding a correction factor to the calculated channel length ($L_{CH}$).

14. The method of claim 13, wherein the correction factor is empirically derived from direct measurement of a statistically significant number of devices.

15. The method of claim 13, wherein the correction factor is derived from a model.

16. A method for determining a junction overlap ($L_{SDJO}$) of a small device on a substrate, the small device having a gate, a source and a drain, wherein a channel is defined between the source and the drain of the small device, the method comprising:

providing a large reference device on the substrate, the reference device having a gate, a source and a drain, wherein a channel of known length ($L_{CH(ref)}$) is defined between the source and the drain of the reference device;

grounding the source and the drain of the reference device and the substrate;

applying a predetermined gate voltage ($V_G$) to the gate of the reference device;

measuring the current ($I_{GC(ref)}$) between the gate and the channel of the reference device;

floating the substrate and one of the source or the drain of the small device;

applying a predetermined drain voltage ($V_D$) to the respective source or drain of the small device which is not floating;

measuring the current ($I_{GD}$) between the gate of the small device and the respective source or drain of the small device which is not floating; and calculating the overlap ($L_{SDJO}$) of the respective source or drain by using the known channel length ($L_{CH(ref)}$) of the reference device, the measured current ($I_{GD}$) between the gate and the respective source or drain of the small device, and the measured current ($I_{GC(ref)}$) between the gate and the channel of the reference device.

17. The method of claim 16, wherein calculating the overlap ($L_{SDJO}$) of the respective source or drain is performed by multiplying the known channel length ($L_{CH(ref)}$) of the reference device by the measured current ($I_{GD}$) between the gate and the respective source or drain of the small device, and dividing by the measured current ($I_{GC(ref)}$) between the gate and the channel of the reference device.

18. The method of claim 16, further comprising determining a channel length ($L_{CH}$) of the small device, the method further comprising:

grounding the source and the drain of the small device and the substrate;

applying the predetermined gate voltage ($V_G$) to the gate of the small device;

measuring the current ($I_{GC}$) between the gate and the channel of the small device; and calculating the channel length ($L_{CH}$) of the small device by using the known channel length ($L_{CH(ref)}$) of the reference device, the measured current ($I_{GC}$) between the gate and the channel of the small device, the measured current ($I_{GC(ref)}$) between the gate and the channel of the large device, and the calculated overlap ($L_{SDJO}$).

19. The method of claim 18, wherein calculating the channel length ($L_{CH}$) of the small device is performed by multiplying the known channel length ($L_{CH(ref)}$) of the reference device by the measured current ($I_{GC}$) between the gate and the channel of the small device, dividing by the measured current ($I_{GC(ref)}$) between the gate and the channel of the large device, and then subtracting twice the calculated overlap ($L_{SDJO}$).

20. The method of claim 18, further comprising adding a correction factor to the calculated channel length ($L_{CH}$).

21. The method of claim 20, wherein the correction factor is empirically derived from direct measurement of a statistically significant number of devices.

22. The method of claim 21, wherein the correction factor is derived from a model.

23. The method of claim 18, wherein the junction overlap ($L_{SDJO}$) and the channel length ($L_{CH}$) are determined in-situ.

24. The method of claim 16, wherein the predetermined gate voltage ($V_G$) is within the operating voltage of the large device and the small device.

25. The method of claim 16, wherein the predetermined gate voltage ($V_G$) is approximately 1.5 volts.

26. The method of claim 16, wherein the channel length ($L_{CH(ref)}$) of the reference device is greater than 4 microns.

27. The method of claim 16, wherein the gate comprises a gate oxide with a thickness of less than 3 nm.

28. The method of claim 16, wherein the small device and the large device are metal-oxide-semiconductor field effect transistors (MOSFETs).

29. The method of claim 16, wherein the predetermined gate voltage ($V_G$) is equal to the predetermined drain voltage ($V_D$).

30. The method of claim 16, wherein the channel length ($L_{CH}$) of the small device is less than 0.5 microns.

* * * * *